(12) United States Patent
Tsao et al.

(10) Patent No.: US 7,036,109 B1
(45) Date of Patent: Apr. 25, 2006

(54) IMAGING INTEGRATED CIRCUITS WITH FOCUSED ION BEAM

(75) Inventors: Chun-Cheng Tsao, Cupertino, CA (US); Theodore R. Lundquist, Dublin, CA (US); William Thompson, Los Altos, CA (US); Erwan Le Roy, San Jose, CA (US); Eugene A. Delenia, Morgan Hill, CA (US)

(73) Assignee: Credence Systems Corporation, Milpitas, CA (US)

( * ) Notice: Subject to any disclaimer, the term of this patent is extended or adjusted under 35 U.S.C. 154(b) by 39 days.

(21) Appl. No.: 10/274,431

(22) Filed: Oct. 17, 2002

(51) Int. Cl.
  *G06F 17/50* (2006.01)
(52) U.S. Cl. ............... 716/21; 716/2; 716/19; 716/20
(58) Field of Classification Search ........... 257/788; 438/689, 14; 716/19, 20, 21, 2
  See application file for complete search history.

(56) References Cited

U.S. PATENT DOCUMENTS

| | | | |
|---|---|---|---|
| 4,169,244 A | 9/1979 | Plows | |
| 4,706,019 A | 11/1987 | Richardson | |
| 5,548,211 A | 8/1996 | Tujide et al. | |
| 5,840,593 A | 11/1998 | Leedy | |
| 5,911,018 A | 6/1999 | Bischel et al. | |
| 5,972,725 A | 10/1999 | Wollesen et al. | |
| 5,990,562 A | 11/1999 | Vallett | |
| 6,093,331 A | 7/2000 | Wollesen | |
| 6,147,399 A | 11/2000 | Li et al. | |
| 6,376,919 B1* | 4/2002 | Li et al. | 257/778 |
| 6,838,294 B1 | 1/2005 | Suthar et al. | |
| 2002/0151091 A1* | 10/2002 | Shaw et al. | 438/14 |
| 2003/0224601 A1* | 12/2003 | Roy et al. | 438/689 |

OTHER PUBLICATIONS

Eiles, T.M., et al., "Transparent Heat Speader for Backside Optical Analysis of High Power Microprocessors," Proceedings of the 26th International Symposium for Testing and Failure Analysis (2000), pp. 547-551.

* cited by examiner

*Primary Examiner*—Thuan Do
(74) *Attorney, Agent, or Firm*—Fish & Richardson P.C.

(57) ABSTRACT

Methods and apparatus for integrated circuit diagnosis, characterization or modification using a focused ion beam. A method for editing an integrated circuit includes acquiring an image of structures of an integrated circuit by applying a focused ion beam to an outer surface of the integrated circuit to visualize structures beneath the outer surface of the integrated circuit. The method includes using the image to find a location of a circuit element in the integrated circuit and then performing one or more editing operations on the circuit element by applying a focused ion beam to the location found.

29 Claims, 6 Drawing Sheets

IMAGING INTEGRATED CIRCUITS WITH FOCUSED ION BEAM

BACKGROUND

This invention relates to integrated circuit diagnosis, characterization, and modification using focused ion beam ("FIB") systems.

FIB systems can be used to micro-mill, perform local deposition, and measure local electrical potential on an integrated circuit ("IC"). Operations such as these, i.e., operations on an IC that are performed using a focused ion beam, will be referred to in this specification as FIB operations. FIB systems are powerful tools because they can be used to perform many IC editing operations, such as circuit repair and modification, as well as IC characterizing operations, such as testing and debugging.

FIB operations have traditionally been performed on the front-side of an IC. The implementation of face-down or flip-chip packaging has created severe limitations for the use of FIB systems because such packaging leaves only the backside, also referred to as the substrate side, of the IC exposed and visible.

Integrating infrared ("IR") imaging devices into a FIB system allows one to perform FIB operations on the backside of an IC. IR light can penetrate a silicon substrate, allowing an operator to find structures of interest situated beneath the substrate. In this context, a structure of an IC can be part of a circuit element of the IC. When an IR imaging device, such as an IR microscope, is integrated into a FIB system, the FIB system can use the IR device to navigate to a structure of interest and then perform FIB operations.

Using blind navigation also allows one to perform FIB operations on the backside of an IC. With blind navigation, one or more fiducial marks on an IC are exposed and used as reference points to navigate to a structure of interest.

SUMMARY

The present invention provides methods and apparatus, including computer program products, for navigation and editing of an IC with a focused ion beam.

In general, in one aspect, a method for editing an integrated circuit includes acquiring an image of structures of an integrated circuit by applying a focused ion beam to an outer surface of the integrated circuit to visualize structures beneath the outer surface of the integrated circuit. The method further includes using the image to find a location of a circuit element in the integrated circuit and then performing one or more editing operations on the circuit element by applying a focused ion beam to the location found.

In general, in another aspect, a system includes a focused-ion-beam column for generating a focused ion beam that, when directed at a location on a surface of an integrated circuit, generates secondary particles. The system includes a detector for detecting the secondary particles. The system includes an image generator for generating, based on an output of the detector, an image of structures underlying the surface of the integrated circuit. The system includes a computing device for navigating, based on the image, to a structure of the integrated circuit.

In general, in another aspect, a machine-readable medium embodying information indicative of instructions for causing a focused ion beam system to perform operations including acquiring an image of underlying structures of the integrated circuit, registering the acquired image to a reference, navigating, by using the reference, to a location on the integrated circuit, and performing focused ion beam operations at the location.

In general, in another aspect, the system applies voltage contrast imaging techniques for navigating, editing, characterizing, probing, and testing from a backside of an IC. The IC, which can be a flip-chip, is thinned and polished so that only a few tens of nanometers of substrate cover the circuit elements. DC power is applied to the IC, causing voltage contrast among structures of the IC. The system acquires an image of the voltage contrast. An image in which IC structures are visible due at least in part to voltage contrast will be referred to in this specification as a voltage contrast image. A voltage contrast image of an IC can be one that is acquired while voltage is being applied to the IC or, alternatively, when no voltage is being supplied to the IC. In the latter case, the voltage contrast can result from a prior application of voltage. The voltage contrast image has a very high resolution that is primarily limited by the diameter of a focused ion beam that was used to acquire the voltage contrast image. The focused ion beam can be generated by the system through a FIB column. The FIB column is a collection of devices for generating a focused ion beam and can include a FIB source, a stack of lenses for focusing, and devices for controlling a focused ion beam. The system aligns the high resolution voltage contrast image to a CAD layout. This operation is also referred to as locking, linking, or registration. The system uses the acquired voltage contrast image and CAD layout to position the FIB column and target a structure of interest.

The invention can be implemented to realize one or more of the following advantages. A FIB system in accordance with the invention can generate and use a focused ion beam to acquire a high resolution voltage contrast image from the backside of the IC. The voltage contrast image is not limited to areas of exposed fiducial marks, but can include an entire area of the IC's circuit. The voltage contrast image can have a resolution that is significantly higher than the resolution of an IR image. The voltage contrast image can have a resolution that is comparable to the diameter of the focused ion beam that was used to acquire the image. The focused ion beam diameter and, hence, the image resolution can be as small as a few nanometers. By using the voltage contrast image, the system can position a FIB column or a sample holder with high precision to find a target structure of the IC.

The system can use the voltage contrast image to navigate to a target structure of the IC without requiring fiduciary marks or relying on IR devices. The navigation can be achieved without exposing fiducial marks or a local area around the target structure. Because the system can acquire an image of an IC by using its generated ion beam to scan the IC, the system can navigate without requiring additional equipment, such as the described conventional IR optical imaging system. Thus, there is no need to coordinate the operation of the additional equipment with that of the FIB system, which coordination consumes computing resources and time.

Optionally, when the IC has been sufficiently thinned, the system can, without having to apply voltage to the IC, acquire an image of structures situated beneath a substrate layer of the IC. An image acquired in this manner will be referred to in this specification as a no applied voltage (or "NAV") image. As with a voltage contrast image, the system can use an NAV image to perform FIB operations.

The system need not rely on material or topographical variation to find structures situated beneath a substrate layer of a IC. The system can rely solely on voltage contrast, which is detectable from either the front or backside of an IC to acquire an image of the underlying structures of the IC.

Unlike systems that use blind navigation, the system can use its generated focused ion beam to acquire an image of the structures of interest and provide feedback to enhance navigation accuracy. Furthermore, the system does not need to perform complicated and expensive processes usually performed during blind navigation. For example, the system can accurately position its FIB column in a single step and without having to expose fiduciary marks.

The system can perform FIB editing and testing operations on an IC while the IC remains mounted on a holder which held the IC while the system acquired the image used for navigation. That is, the system can navigate and perform FIB operations in place. When the substrate is thinned before navigation, one does not have to thin at the structure of interest before performing the FIB operation. The FIB operation can be done without local trenching, which saves time and expense. The FIB operation can be done without damaging the circuit or making it inoperative. With its imaging capabilities, the system can perform, on the backside of an IC, FIB operations that are traditionally performed on the front side of the IC.

The details of one or more embodiments of the invention are set forth in the accompanying drawings and the description below. Other features and advantages of the invention will be apparent from the description, drawings, and claims.

DESCRIPTION OF DRAWINGS

FIG. 3 shows a method for using a focused ion beam to acquire a voltage contrast image.

Like reference symbols in the various drawings indicate like elements.

DETAILED DESCRIPTION

Figure 1:
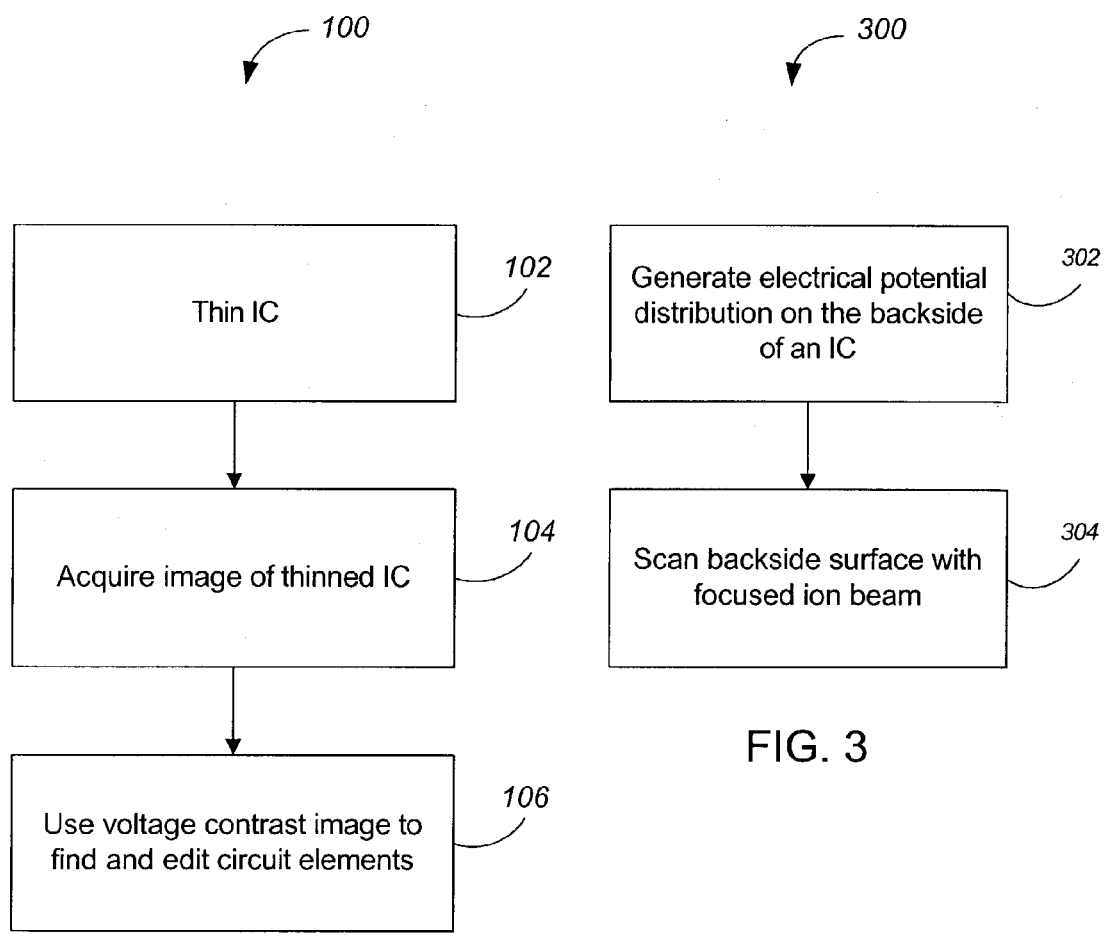
FIG. 1 shows a method for using a FIB to find and edit a target circuit element of an IC in one implementation of the invention.

FIG. 1 shows a method 100 for using a focused ion beam to find and edit a target circuit element of an IC. The IC is thinned (step 102). The IC can be thinned by globally thinning and polishing the backside on the IC by applying, e.g., a mechanical thinning technique described in commonly assigned U.S. patent application Ser. No. 09/924,736, entitled Method for Global Die Thinning and Polishing of Flip chip Packaged Integrated Circuits, filed Aug. 7, 2001, the disclosure of which is hereby incorporated by reference in its entirety. Alternatively, other thinning techniques can be applied, including techniques such as global or local substrate removal by laser, FIB trenching, wet chemical etching, and dry plasma etching. These other techniques are further described in Marshall et al., *FIB Back Side Isolation Techniques*, Microelectronics Failure Analysis Desk Reference (2001).

Alternatively, the thinning can be performed by a system that integrates thinning devices, such as a laser etching tool, with devices for performing FIB operations. In this case, the IC is mounted on a sample holder before thinning; and subsequent thinning, navigation, and editing operations, as well as other FIB operations, can be performed without removing the IC from the sample holder. When thinning is performed by a system that is separate from the FIB system, the thinned IC needs to be mounted on a sample holder of the FIB system before commencing FIB operations.

Alternatively, manufacturing technologies may provide ICs that have a sufficiently thin substrate and therefore do not need thinning. In this case, one can proceed directly to the FIB operations.

Figure 2:
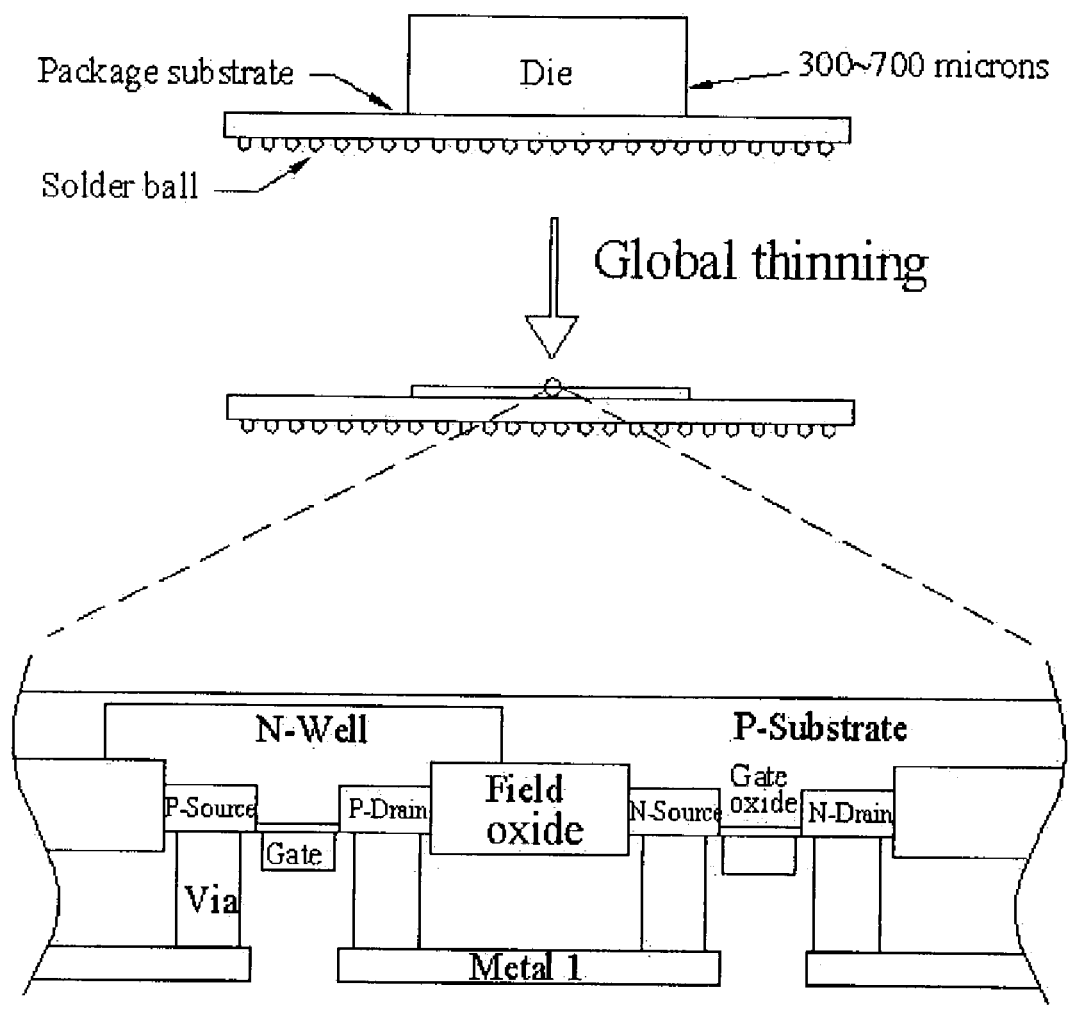
FIG. 2 shows an example of a thinned flip-chip.

The amount of thinning needed depends on many factors, such as the substrate penetration capability of the FIB being used, the material composition of the IC being tested, and the amount of voltage applied to the IC. Generally, the substrate must be sufficiently thin so that the structures situated beneath the substrate are distinguishable from each other due to differences in characteristics such as voltage potential and material composition. In any case, enough substrate should be left so that the integrated circuit remains fully functional. Thinning, for example, should leave approximately a few hundred nanometers of P-type silicon substrate covering an N-well of a P-channel transistor. FIG. 2 shows an example of a flip-chip that has been globally thinned so that the N-wells are nearly exposed in order to acquire a voltage contrast image. Non-destructive techniques should be used to measure the thickness of the substrate layer. These techniques include, for example, refractometry and reflectometry.

Optionally, the IC can then be tested to ensure that the IC is fully functional. The tests can include, for example, activating the IC, applying an input, and verifying the response.

The system acquires an image of the thinned IC (step 104). The system applies voltage to cause voltage contrast among the structures of the IC. A sample holder of the system, for example, can provide electrical power and signal connections to the IC. The system generates and uses a focused ion beam to scan the backside of the IC and acquire a voltage contrast image. The process of acquiring a voltage contrast image is further described below in reference to FIGS. 3, 4A, 4B, 5A, and 5B, and also in commonly-owned U.S. patent application Ser. No. 10/123,842, entitled Measuring Backside Voltage of an Integrated Circuit, filed on Apr. 15, 2002, which application is hereby incorporated by reference in its entirety.

If the applied voltage is sufficiently high, the IC may be activated. The IC need not be activated, however, in order to acquire a voltage contrast image. In fact, a voltage contrast image can be acquired even when voltage is not being applied to the IC. That is, a voltage contrast image can be obtain even after a voltage source to the IC has been turned off. Voltage contrast can result from residual charges, dielectric effects, resistive effects, or any combination thereof.

Alternatively, when the IC is sufficiently thinned, the system can acquire an image of the underlying structures of an IC without applying voltage at all to the IC. In this case, in addition to the above mentioned causes of voltage contrast, the material variation, topographical variation, or any combination of these variations among the structures can give rise to an image of the IC's underlying structures. To acquire an image, the system generates a FIB and scans the backside of the IC just as it does to acquire a voltage contrast image.

The system uses the acquired image to find and edit one or more circuit element of interest (step 106). The system registers the acquired image with a reference, such as a CAD layout, to correlate the structures of the voltage contrast image to corresponding structures of a reference image, such as the CAD layout. Registration allows the system to navigate the IC and find the one or more structures of interest. In this context, navigation can include interaction with a human operator who can specify, for example, the structure of interest. Registration is further described below in reference to FIG. 5. Once it completes registration, the system positions its FIB column, sample holder, or both to target the one or more structures of interest and edit the IC in place. Alternatively, the system can perform other FIB operations such as characterization, testing, or any combination of editing, characterization, and testing. For a globally thinned IC, the system can also edit, characterize, or perform other FIB operations right after navigating to a circuit element of interest because trenching is not required. At any stage of the FIB operation, the system can acquire a voltage contrast image for visual feedback of the changes made by the FIB operation or for verifying FIB positioning.

FIG. 3 shows a method 300 for using a focused ion beam to acquire a voltage contrast image from a backside of an IC. Voltage is applied to the IC to generate electrical potential distribution, i.e., voltage contrast, on the backside of the IC (step 302). The electrical potential distribution corresponds at least in part to the spatial distribution of the structures of the IC and, thus, can be used to identify structures of the IC.

One way to generate electrical potential distribution is to apply DC power to the IC. The electrical potential distribution can then be mapped by probing with a focused ion beam from the backside of the IC. Optionally, the system can include a controller that controls the voltage applied to the IC. The controller is further described below.

In one implementation, the system generates electrical potential at the N-wells of an IC. Complementary metal-oxide semiconductor ("CMOS") ICs include N-type and P-type transistors, which are made by forming N-type and P-type wells in a semiconductor substrate. For normal FIB operations, the substrate is grounded and the N-well is connected to a bias voltage source. $V_{bias}$ refers to a voltage level supplied by the bias voltage source to the IC. $V_{bias}$ can be different for different ICs and depends on various factors, including the design of the IC. The bias voltage can differ from the IC's normal operating voltage $V_{dd}$. The bias voltage generates electrical potential in the vicinity of the N-well, which induces a change in the electrical potential of the local substrate surface. An IC usually includes more than one N-well. The backside of the IC, thus, will have a distribution of electrical potential that correlates to the spatial distribution of the N-wells.

The system uses the focused ion beam to scan the surface of the backside of the IC and store the result as a voltage contrast image (step 304). The system can perform a raster scan of the outer surface of the backside by moving the focused ion beam over an area of the backside. To perform the scan, the system can use a controller, which can be separate from the above-described one that is used for controlling the voltage input to the IC. The controller can either move the FIB column, the IC holder, or both. As the focused ion beam is moved across the scanned area, the system, through a detector, measures the intensity of secondary charged particles. Secondary charged particles are mostly electrons that are generated by the inelastic impact of FIB particles striking the backside surface of the IC. The intensity of secondary electrons that reach the detector is a function of the electrical potential on the backside surface. The system forms a voltage contrast image by assigning the measured intensity of a location to a pixel that represents that location. The system can store in memory the acquired voltage contrast image.

In alternative designs, the system measures the energy of secondary particles, such as electrons. The energy of secondary particles depends, among other factors, on the local electric potential. The measured energies can be used to refine feature resolution in the voltage contrast image, or to characterize the IC.

As discussed, both $V_{bias}$ and the thickness of the substrate layer covering the N-wells determine the visibility of N-well structures in a voltage contrast image. Either the $V_{bias}$, the substrate thickness, or both can be changed as needed to produce a voltage contrast image showing the structures of interest. $V_{bias}$ can range between the maximum operational voltage and zero. Biasing an IC above its maximum operational voltage can damage the IC. A $V_{bias}$ of 0.5 volts, by way of example, can make exposed N-wells visible in a voltage contrast image. N-wells that are not exposed can require a higher $V_{bias}$ to induce an electrical potential that is detectable by a FIB system. For silicon CMOS ICs having a typical operational $V_{dd}$ of 3.3 volts or less, the substrate layer should be thinned to a few hundred nanometers in order to acquire a voltage contrast image showing all the structures of interest. Generally, a substrate thickness of about 500 nanometers or less can yield an image that can be used for registration.

Figure 4A:
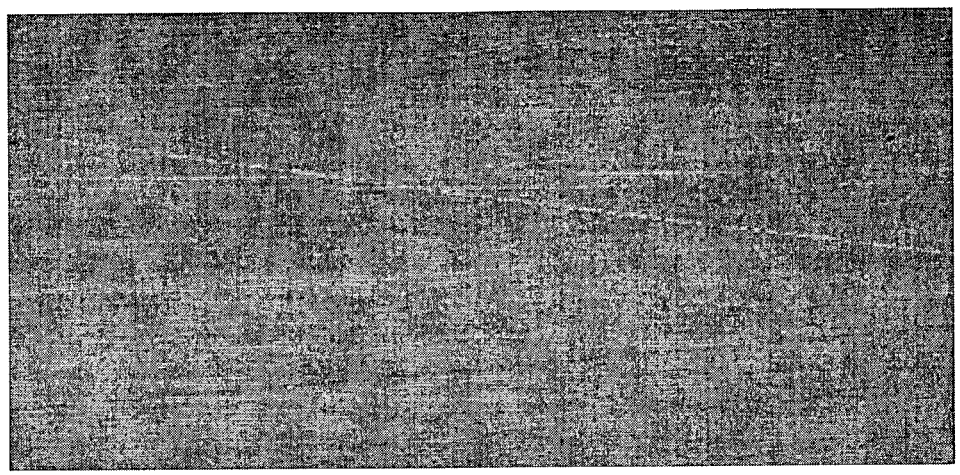
FIG. 4A shows an image acquired, without applied voltage, from the backside of a thinned flip-chip IC with an underlying N-well layer.
Figure 4B:
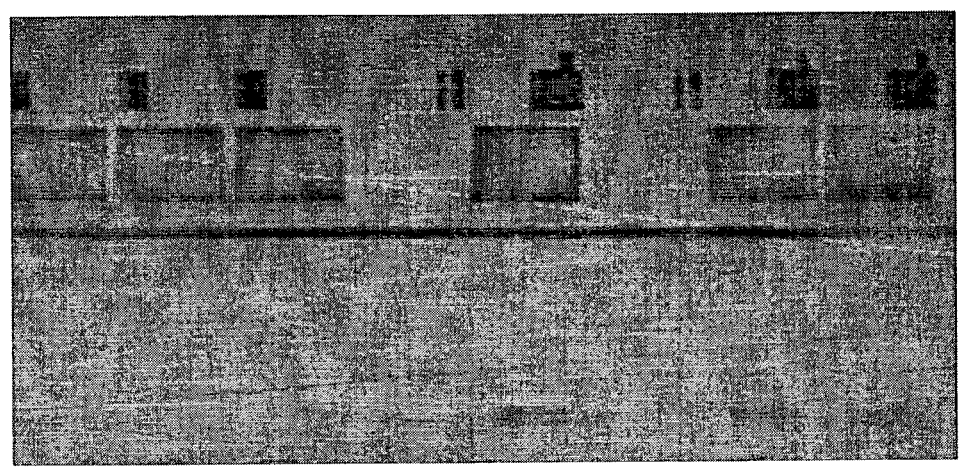
FIG. 4B shows a voltage contrast image acquired with voltage applied to the N-well layer of the thinned flip-chip IC of FIG. 4A.

FIGS. 4A and 4B show two images of a first scanned area. The two images were acquired from the backside of a thinned flip-chip IC, which has a substrate thickness of approximately 200 nanometers. FIG. 4A shows an image acquired without applying voltage to the N-well layer. There are no visible elements. FIG. 4B shows another image of the first scanned area. This image, which is a voltage contrast image, was acquired when a $V_{bias}$ of 3.3V was applied to the N-well layer and the substrate was grounded. Unlike the image of FIG. 4A, the image of FIG. 4B shows multiple surface features, which correspond to the underlying N-well structures. Because a positive voltage was applied, the detected features appear as dark areas representing lower intensities of secondary electrons.

Figure 5A:
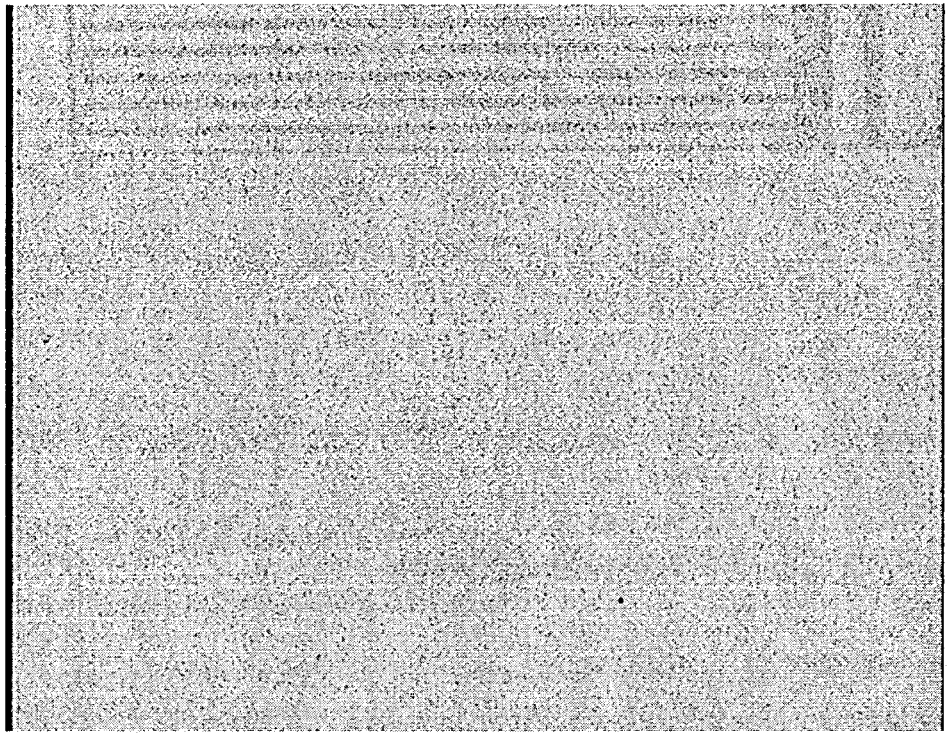
FIG. 5A shows a voltage contrast image acquired with a voltage of 0.5V applied to the N-well layer of a thinned flip-chip IC.
Figure 5B:
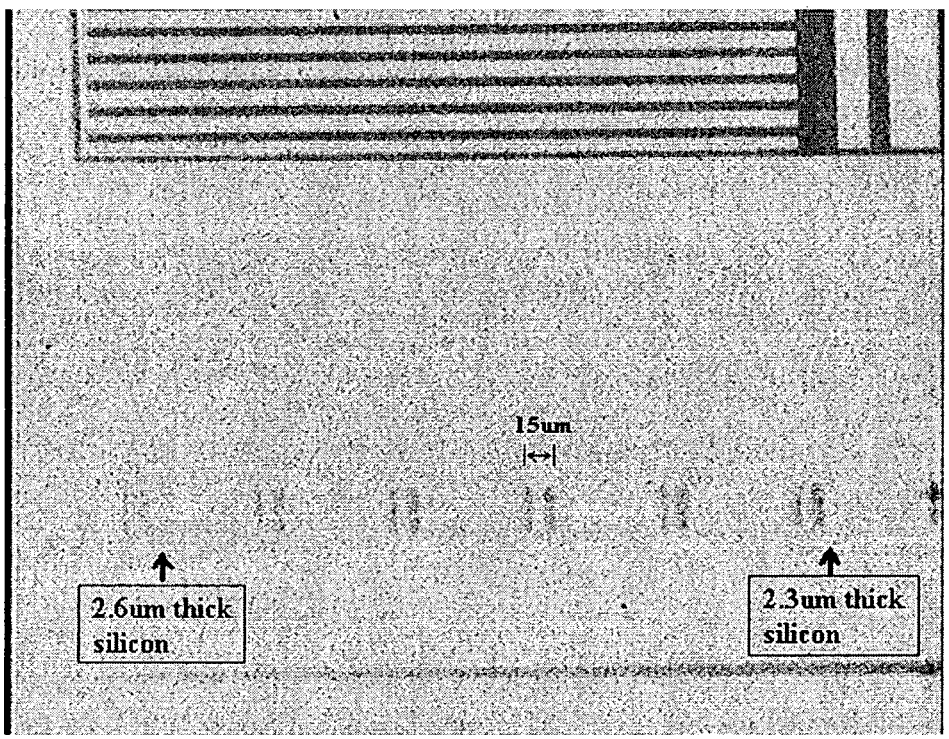
FIG. 5B shows a voltage contrast image acquired with a voltage of 3.0V applied to the N-well layer of the thinned flip-chip IC of FIG. 4A.

FIGS. 5A and 5B show two voltage contrast images of a second scanned area. The two images were acquired from the backside of a thinned flip-chip IC. FIG. 5A shows a voltage contrast image acquired when 0.5V was applied to the N-well layer of the thinned flip-chip IC. For exposed N-well structures, an applied $V_{bias}$ of 0.5V is sufficient to produce a visible voltage contrast image acquired with the focused ion beam. However, N-well structures shown in FIG. 5A are covered by a substrate layer of non-uniform thickness. Biasing with 0.5V is insufficient to make all N-well structures visible in the image. Those N-well structures beneath the thicker portion of the substrate are not visible in the image. FIG. 5B shows a second voltage contrast image acquired when the applied $V_{bias}$ is increased from 0.5V to 3.3V, which is the operational voltage for the flip-chip IC. The increased $V_{bias}$ allows the system to produce an image that includes N-wells that were not detectable when $V_{bias}$ was only 0.5V.

In the IC shown in FIG. 5B, the total thickness of the silicon substrate changes across the second viewing area. The total thickness decreases from 2.6 micrometer on the left to 2.3 micrometer on the right. The 300 nanometer decrease in thickness changes the detected voltage contrast. The decreasing thickness causes voltage contrast features to be more visible on the right than on the left. A typical operating voltage level is 3.3V or less for most CMOS ICs.

Figure 6:
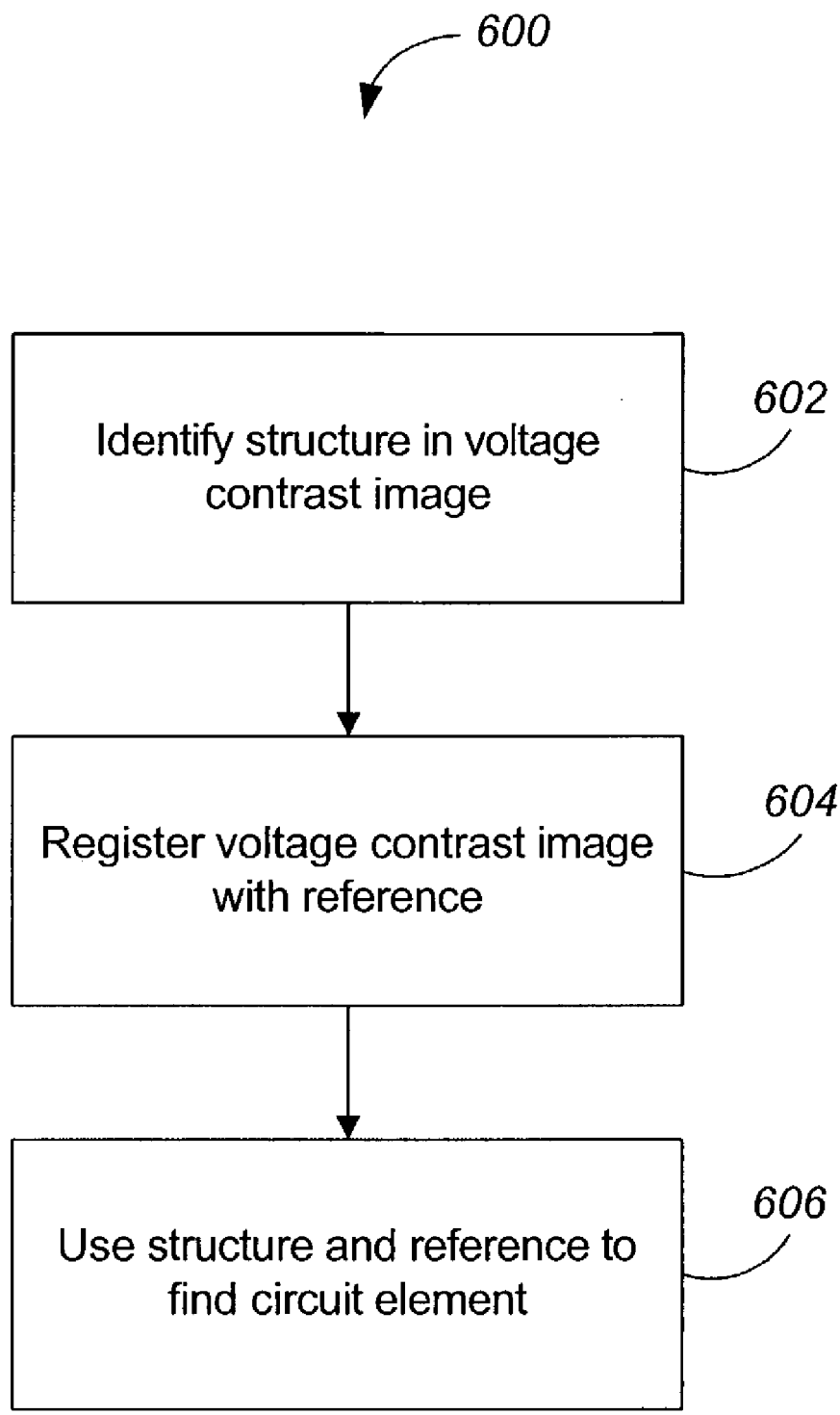
FIG. 6 shows a method for using a focused ion beam to find a target circuit element.

FIG. 6 shows a method 600 for using a FIB system to find a structure of an IC. The system identifies a structure in the voltage contrast image (step 602). The identified structure can be part of a circuit element. For example, the structure can be an N-well of a particular transistor. The identified structure is usually one that is close or part of to a circuit element to be edited, tested, or characterized. For example, to find a diffusion region of a transistor to be edited, the system identifies the N-well structure of the transistor.

Figure 4C:
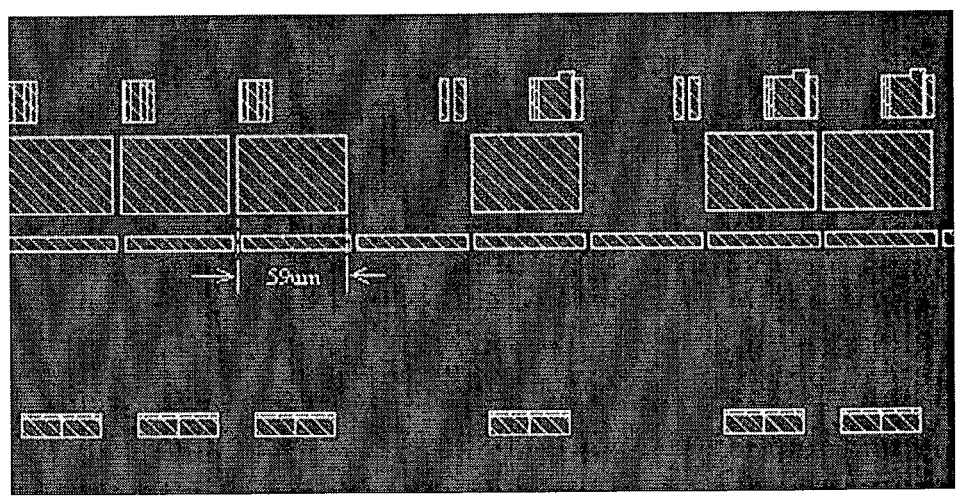
FIG. 4C shows a computer aided design ("CAD") layout image of the IC of FIGS. 4A and 4B.

The system registers an acquired voltage contrast image with a reference (step 604). The reference can be a CAD layout image, an example of which is shown in FIG. 4C. Alternatively, the reference can be any other source of information that describes the spatial distribution of the structures of the IC.

The system uses the identified voltage contrast structure and the reference to find the circuit element of interest (step 606). The system uses the identified structure as a reference point and the reference as a map to navigate the IC. The circuit element interest can be beneath the substrate of the IC, and may be invisible on the voltage contrast image. Examples of such circuit elements include diffusion regions such as the diffusion regions 705 and 706 shown in FIG. 7.

Figure 7:
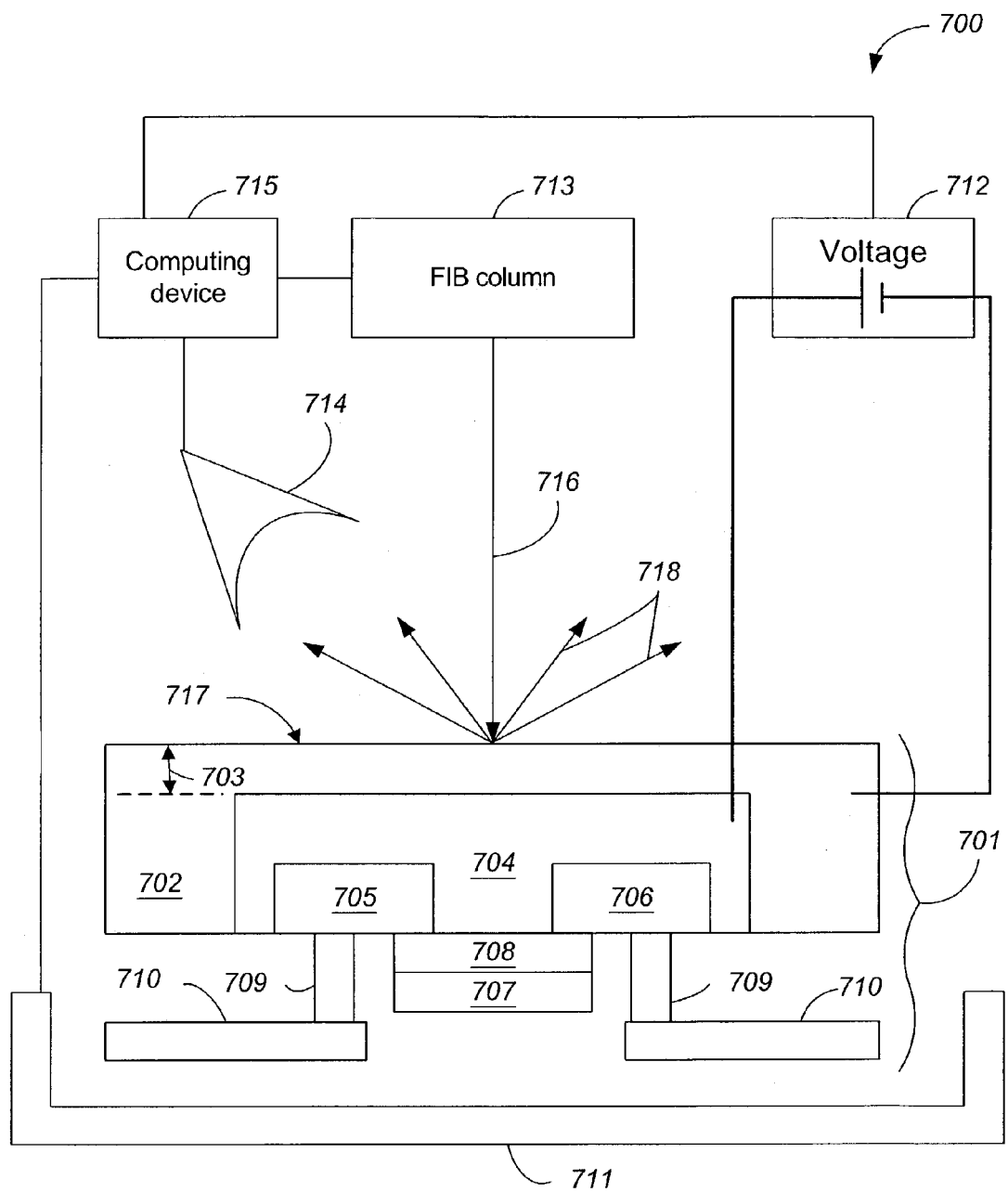
FIG. 7 shows a system in accordance with the invention.

FIG. 7 shows a FIB system 700 in one implementation of the invention. The FIB system 700 can perform FIB operations, such as editing, on an IC 701. The system 700 includes a sample holder 711, a voltage source 712, a FIB column 713, a detector 714, a computing device 715, and one or more controllers. Optionally, the system 700 includes thinning devices, such as a silicon-etching laser, and thickness-measurement devices.

A controller can be designed and implemented as one part or component—e.g., a programmed processor—or as multiple ones. For example, a single controller can control the operation of the detector 714. Alternatively, two or more controllers can control the operation of the detector 714. Furthermore, a single controller can control more than one component of the system 700. For example, a single controller can control the detector 714, the FIB column 713, and the sample holder 711. Optionally, each component of the system can have its own controller.

The computing device 715 can be a computer that includes memory and one or more processors, programmed to cause the system to perform the actions described in this specification. The computing device 715 provides instructions to the controllers and, furthermore, coordinates system operations with each controller. The computing device 715 can also receive and process data representing the intensity of the secondary particles detected by the detector 714.

The computing device and the controllers are interconnected to exchange information, which can include control signals and data. The computing device 715 can transmit and receive instructions to and from the controllers, which in turn can transmit control signals to and receive data from the sample holder 711, the voltage source 712, the FIB column 713, the detector 714, as well as other components of the system 700. When, for example, the system 700 includes thinning devices and substrate thickness measurement devices, controllers are also connected to these devices. The computing device 715 can also be connected to receive and store data directly or indirectly from the detector 714 and, optionally, from the other components.

The sample holder 711 can provide electrical connections for the IC 701, and can position the IC 701 for FIB operations, both actions being in accordance with signals from the controller 711. Optionally, the sample holder 711 includes devices, such as motors and tracks, that enables holder to move relative to the FIB column 713.

The voltage source 712, FIB column 713, and detector 714 operate in accordance with signals from the controllers and the computing device. The voltage source 712 can, for example, apply particular voltages to particular pins of the IC as directed by control signals from its controller. In response to control signals from its controller, the FIB column 713 can generate a focused ion beam at a particular time in a test cycle. Testing is further described below. Likewise, in response to control signals from its controller, the detector 714 can activate its aperture at the particular time when the FIB column 713 generates a focused ion beam. FIB system are further described in the above cited U.S. patent application Ser. No. 10/123,842.

To test the IC, the FIB system can be connected to exchange information with a tester that provides test vectors to the IC 701. The described electrical connections of the sample holder 711 can, for example, provide a path for the tester to send test vectors to the IC. The computing device 715 can also be connected to exchange information with the tester to cause, for example, the tester to send test vectors to the IC.

During FIB operations, the FIB column 713 directs a focused ion beam 716 on a point on an outer surface 717. Interacting with the outer surface 717, the focused ion beam 716 generates secondary charged particles 718. The secondary charged particles 718 include electrons and ions. Secondary charged particles, typically the electrons, are detected by the detector 714, which can be a photomultiplier. The controller receives an output of the detector 714 and processes the output to generate, for example, a voltage contrast image, edit the IC 701, and test the IC 701.

One example of an IC with which the system 700 can be used is IC 701, a flip-chip with a silicon substrate 702. The substrate 702 is a P-type substrate. Alternatively, the substrate can be an N-type substrate. The substrate 702 has a thickness 703 from the deepest wells. The IC 701 has a CMOS design. The deepest well is an N-well 704 of a P-channel transistor. Alternatively, the deepest well can be a P-well of an N-channel transistor. P-type dopant was diffused into the N-well 704 to form a diffusion source 705 and a diffusion drain 706 of the P-channel transistor. The source 705 and drain 706 are connected with a gate 707 having a gate oxide layer 708. Electrical contact can be made with the diffusion source 705 or drain 706 through a contact 709 and metal lines 710. During imaging, the substrate 702 is grounded. When voltage is applied at the N-well 704, a voltage contrast can be detected between the N-well 704 and the substrate 702. The system 700 can be used with other types of ICs, such as, by way of example, ICs that have substrates made of gallium arsenide, selenium germanium doped with carbon, and indium phosphoride.

Various aspects of the invention, including the method steps described, can be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks.

Information carriers suitable for embodying computer program instructions and data include all forms of non-volatile memory, including by way of example semiconductor memory devices, e.g., EPROM, EEPROM, and flash memory devices; magnetic disks such as internal hard disks and removable disks; magneto-optical disks; and CD-ROM and DVD-ROM disks. The processor and the memory can be supplemented by, or incorporated in special purpose logic circuitry.

A number of implementations of the invention have been described. Nevertheless, it will be understood that various modifications may be made without departing from the spirit and scope of the invention. For example, the steps of the invention can be performed in a different order and still achieve desirable results. The invention can be implemented for application to kinds of substrates other than those specifically mentioned, including gallium arsenide substrates and N-type silicon substrates. The system described can perform any FIB operations in place after registration. The system can use any ion source appropriate for IC work. For example, the system can use a liquid ion source, liquid metal ion source, gas ion source, or any combination thereof. Suitable liquid metal ion sources include gallium, gold indium, and gold silicon liquid metals. Suitable gas ion sources include argon gas. The system can include more than one controller. The controller can include one or more processors. The computing device can include any suitable computing device, such as a server and a workstation. Accordingly, other implementations are within the scope of the following claims.

What is claimed is:

1. A method for editing an integrated circuit, the method comprising:
   acquiring an image of structures of an integrated circuit by applying a focused ion beam to an outer surface of the integrated circuit to visualize structures beneath the outer surface of the integrated circuit, the image being acquired while no voltage is being applied to the structures of the integrated circuit; and
   using the image to find a location of a circuit element in the integrated circuit and then performing one or more editing operations on the circuit element by applying a focused ion beam to the location found.

2. The method of claim 1, wherein the outer surface is a surface of a substrate layer, the method further comprising:
   thinning the substrate layer before acquiring the image.

3. The method of claim 2, wherein thinning the substrate layer comprises planarizing the substrate layer.

4. The method of claim 3, wherein planarizing includes polishing.

5. The method of claim 2, further comprising:
   thinning the substrate layer to leave a thickness with which the integrated circuit remains fully functional.

6. The method of claim 2, wherein:
   thinning includes thinning the substrate layer to a thickness of approximately 500 nanometers.

7. The method of claim 2, further comprising:
   testing the integrated circuit after thinning; and
   editing the integrated circuit.

8. The method of claim 7, wherein acquiring the image includes acquiring the image while the integrated circuit is mounted on a holder, the method further comprising:
   testing the integrated circuit while the integrated circuit remains mounted on the holder.

9. The method of claim 1, wherein the one or more editing operations include repair and modification of the integrated circuit.

10. The method of claim 1, further comprising:
    characterizing the integrated circuit.

11. The method of claim 10, wherein:
    the image is acquired with the integrated circuit mounted on a holder; and
    the integrated circuit is characterized without having been removed from the holder after the image was acquired.

12. The method of claim 10, wherein:
    the outer surface of the integrated circuit is a front side of the integrated circuit; and
    characterizing includes characterizing using the image.

13. The method of claim 1, wherein:
    the acquired image is an image of voltage contrasts resulting from an application of voltage to the structures of the integrated circuit prior to acquiring the image.

14. The method of claim 13, wherein:
    the application of voltage to the structures of the integrated circuit prior to acquiring the image includes an application of voltage to a plurality of the circuit elements, the plurality of circuit elements including one of au N-well layer, a P diffusion within an N-well layer, a P-well layer, and an N diffusion within a P-well layer of the integrated circuit, the application of voltage inducing a plurality of electrical potentials on the outer surface of the integrated circuit; and
    acquiring the image includes detecting the plurality of electrical potentials as surface features on the outer surface while no voltage is being applied to the structures of the integrated circuit.

15. The method of claim 1, wherein using the image to find the location of the circuit element includes:
    using a reference and the image to navigate to the location of the circuit element.

16. The method of claim 15, wherein the reference is a CAD layout image, the method further comprising:
    aligning the image with the CAD layout image.

17. The method of claim 1, further comprising:
    editing and testing the IC while the IC is activated.

18. The method of claim 1, wherein:
    the image includes information about a thickness of the integrated circuit.

19. The method of claim 1, wherein:
performing one or more editing operations includes acquiring a feedback image of changes made by the one or more editing operations.

20. A system, comprising:
a focused-ion-beam column configured to generate a focused ion beam that, when directed at a location on a surface of an integrated circuit, generates secondary particles;
a detector configured to detect the secondary particles; and
a computing device, wherein the system is configured to generate an image of structures underlying the surface of the integrated circuit, the image being generated from secondary particles detected while no voltage is being applied to the structures, and wherein the computing device is configured to use the image to navigate to a structure of the integrated circuit.

21. The system of claim 20, wherein:
the computing device is further configured to operate the column to edit the integrated circuit.

22. The system of claim 20, further comprising a voltage source configured to apply voltage to the integrated circuit in accordance to instructions from the computing device, wherein:
the computing device is configured to cause the voltage source to apply voltage to the integrated circuit before the secondary particles from which the image is generated are detected; and
the image is a voltage contrast image.

23. The system of claim 20, wherein the surface of the integrated circuit is a surface of a substrate, the system further comprising:
a substrate thinning device configured to thin the substrate in accordance to instructions from the computing device.

24. The system of claim 23, wherein the substrate thinning device is a silicon-etching laser.

25. The system of claim 23, further comprising:
a thickness-measuring device.

26. The system of claim 20, further comprising:
a sample holder that includes electrical connections that provide a signal path for the IC to receive test vectors from a tester, the computing device being configured to cause a tester to send test vectors to the IC.

27. A machine-readable medium embodying information indicative of instructions for causing a focused ion beam system to perform operations comprising:
acquiring, by using a focused ion beam, an image of underlying structures of an integrated circuit while no voltage is being applied to the underlying structures of the integrated circuit;
registering the acquired image to a reference;
navigating, by using the reference, to a location on the integrated circuit; and
performing focused ion beam operations at the location.

28. The medium of claim 27, wherein the focused ion beam system includes a substrate thinning device, the medium further comprising information indicative of instructions to cause the focused ion beam system to:
thin a substrate of the integrated circuit under which the structures lie.

29. The medium of claim 27, wherein the focused ion beam system includes a voltage source, the medium further comprising information indicative of instructions to cause the focused ion beam system to:
apply voltage to the integrated circuit prior to acquiring the image of the underlying structures.

* * * * *

UNITED STATES PATENT AND TRADEMARK OFFICE
CERTIFICATE OF CORRECTION

PATENT NO. : 7,036,109 B1 Page 1 of 1
APPLICATION NO. : 10/274431
DATED : April 25, 2006
INVENTOR(S) : Chun-Cheng Tsao et al.

It is certified that error appears in the above-identified patent and that said Letters Patent is hereby corrected as shown below:

Column 10, line 46, delete "au" and replace with --an--.

Signed and Sealed this

Twelfth Day of September, 2006

JON W. DUDAS
*Director of the United States Patent and Trademark Office*